United States Patent
Wang

(10) Patent No.: US 12,231,101 B2
(45) Date of Patent: Feb. 18, 2025

(54) HARMONIC CONTROL-BASED CLASS-J DISTRIBUTED POWER AMPLIFIER AND OPTIMIZATION METHOD THEREOF

(71) Applicant: Cong Wang, Shandong (CN)

(72) Inventor: Cong Wang, Shandong (CN)

(73) Assignee: Cong Wang, Qingdao (CN)

( * ) Notice: Subject to any disclaimer, the term of this patent is extended or adjusted under 35 U.S.C. 154(b) by 0 days.

(21) Appl. No.: 18/811,100

(22) Filed: Aug. 21, 2024

(65) Prior Publication Data
US 2024/0413802 A1    Dec. 12, 2024

Related U.S. Application Data

(63) Continuation of application No. PCT/CN2023/084167, filed on Mar. 27, 2023.

(30) Foreign Application Priority Data

May 23, 2022    (CN) .......................... 202210562775.2

(51) Int. Cl.
| | | |
|---|---|---|
| H03F 3/60 | (2006.01) | |
| H03F 1/56 | (2006.01) | |
| H03F 3/24 | (2006.01) | |

(52) U.S. Cl.
CPC .............. *H03F 3/607* (2013.01); *H03F 1/56* (2013.01); *H03F 3/245* (2013.01); *H03F 2200/255* (2013.01)

(58) Field of Classification Search
CPC .................................... H03F 3/60; H03F 3/605
(Continued)

(56) References Cited

U.S. PATENT DOCUMENTS 7,843,268 B2 * 11/2010 Benson ................... H03F 1/223
                                                               330/286
7,915,957 B2 *  3/2011 Nojima ................... H03F 1/223
                                                               330/286

(Continued)

FOREIGN PATENT DOCUMENTS

CN    111628737 A    9/2020
CN    113162554 A    7/2021
(Continued)

OTHER PUBLICATIONS

International Search Report of PCT/CN2023/084167.
Written Opinion of PCT/CN2023/084167.

*Primary Examiner* — Henry Choe

(57) ABSTRACT

Provided are a harmonic control-based class-J distributed power amplifier and an optimization method thereof. The object of the present disclosure aims to solve the problems of low output power, low efficiency and low gain of distributed amplifiers resulting from non-uniform drive states of transistors at different positions and the like in the distributed amplifiers. The harmonic control-based distributed power amplifier includes an input artificial uniform transmission line, an output artificial non-uniform transmission line, and plural gain units. Two ports of the output artificial non-uniform transmission line are respectively connected with reactive terminals, and in each gain unit, a gate electrode of a transistor is connected with an RC parallel resonant circuit. In the present disclosure, based on load pull method and harmonic control technology, a purely reactive terminal network is added in the NDA terminal open-circuit structure.

3 Claims, 5 Drawing Sheets

(58) Field of Classification Search
USPC .......................................... 330/286, 54, 53
See application file for complete search history.

(56) References Cited

U.S. PATENT DOCUMENTS

| | | | |
|---|---|---|---|
| 7,924,097 B2* | 4/2011 | Lender, Jr. | ............. H03F 3/607 |
| | | | 330/54 |
| 2004/0000951 A1* | 1/2004 | Stengel | ................... H03F 3/605 |
| | | | 330/286 |
| 2012/0229216 A1* | 9/2012 | Benson | .................... H03F 1/42 |
| | | | 330/291 |
| 2014/0111279 A1* | 4/2014 | Brobston | ............. H03F 1/0222 |
| | | | 330/286 |
| 2022/0123702 A1 | 4/2022 | Jo et al. | |

FOREIGN PATENT DOCUMENTS

| CN | 114172476 A | 3/2022 |
|---|---|---|
| CN | 114244295 A | 3/2022 |
| CN | 114884472 A | 8/2022 |

\* cited by examiner

HARMONIC CONTROL-BASED CLASS-J DISTRIBUTED POWER AMPLIFIER AND OPTIMIZATION METHOD THEREOF

CROSS-REFERENCE TO RELATED APPLICATIONS

This application is a bypass continuation application of PCT application no.: PCT/CN2023/084167. This application claims priorities from PCT Application PCT/CN2023/084167, filed Mar. 27, 2023, and from Chinese patent application 202210562775.2, filed May 23, 2022, the contents of which are incorporated herein in the entirety by reference.

TECHNICAL FIELD

The present disclosure relates to an ultra-wideband power amplifier, and specifically, by establishing a class-J distributed power amplifier circuit architecture, the present disclosure provides a high-octave high-efficiency distributed power amplifier based on harmonic impedance optimization of artificial transmission line and a design method thereof.

BACKGROUND

With quick development and revolution of the world communication technologies and continuous expansion of the coverage of the military combat systems, the electromagnetic environment where the communication systems are located becomes increasingly complex. Due to the advantages of high rate, high covertness, high penetration, strong interference immunity and low cost, the ultra-wideband technology is an important technology in the communication and test fields and can be widely applied to electronic countermeasures, military communications, wireless communication test systems, Electro Magnetic Compatibility (EMC) test systems and the like. Based on Shannon's Theorem, the increase of the band width will result in linear increase of the communication capacity and the cost paid for increasing the communication capacity by increasing the power will be exponentially increased. The bandwidth used by the ultra-wideband technology serving as a new high-speed and short-distance wireless technology can be several octaves. In the case of increasing pressure of the spectrum resources, the ultra-wideband technology opens a brand-new path of spectrum resource utilization.

In the entire radio frequency links, the power amplifiers at the transmitters have been always one of key devices which affect key indexes such as link efficiency, power and gain and the like. In recent years, in the applications such as electronic warfare, EMC test systems and wireless communication systems and the like, the requirements of ultra bandwidth, high efficiency, high power and high integration and the like are proposed for the power amplifiers. As the third-generation semiconductor material, gallium nitride becomes the first choice for manufacturing ultra-wideband monolithic microwave integrated power amplifier due to its high power density, good heat dissipation performance, strong interference immunity and excellent high frequency characteristics.

Today, the Monolithic Microwave Integrated Circuits (MMIC) based on gallium nitride process are gradually introduced into the commercial radio frequency microwave systems. When the usual working frequency range of the power amplifiers reaches several octaves, the power amplifiers are called ultra-wideband power amplifiers. When the ultra-wideband power amplifiers are used in the radio frequency systems, it is required to obtain a proper and flat gain on the wide frequency band. For this reason, a distributed amplifier (DA) comes into being. A gate line inductor and a drain line inductor of the distributed power amplifier form an artificial transmission line with a gate-drain capacitor and a drain-source capacitor of the power amplifier device and a flat gain can be achieved in an extremely wide frequency band, and is very applicable to monolithic integration. Therefore, researches on modeling, designing and process of the monolithic integrated gallium nitride ultra-wideband distributed power amplifiers have become hot topics nowadays. FIG. 1 is a circuit structure topology of a conventional Non-uniform Distributed Amplifier (DNA). However, compared with the narrowband power amplifiers, the working locations with such wide frequency bands pose many challenges to the designing of the circuits and systems, especially to the designing of the power amplifiers. Its main indexes such as output power (Pout), gain (Gain) and Power Added Efficiency (PAE) and the like have been always difficult to improve.

SUMMARY

In order to solve the problems of low output power, low efficiency and low gain of distributed amplifiers resulting from loss of reverse transmission of some output signals, frequency change characteristics of optimal load impedance and non-uniform drive states of transistors at different positions in the distributed amplifiers, the present disclosure provides a high-octave high-efficiency distributed amplifier based on harmonic impedance optimization of artificial transmission line and an optimization method thereof.

The present disclosure provides a harmonic control-based distributed power amplifier, which includes an input artificial uniform transmission line, an output artificial non-uniform transmission line, and plural gain units, wherein two ports of the output artificial non-uniform transmission line are respectively connected with reactive terminals ($L_1$ and $L_2$), and in each gain unit, a gate electrode of a transistor is connected with an RC parallel resonant circuit.

In the present disclosure, based on physics-based precision large-signal power transistor model, parameters such as input and output capacitances and output impedance and the like of each transistor are extracted, and input and output artificial transmission lines and reactive terminal network are designed. In this way, impedance matching of the transistors is achieved and the use of the good port voltage standing-wave coefficient distributed architecture greatly expands the working bandwidth of the power amplifier.

The present disclosure provides a class-J distributed ultra-wideband power amplifier of power combination, which includes two harmonic control-based distributed power amplifiers, a power distribution network, a power combination network and a class-J amplifier output matching network. Two ports of the power distribution network are respectively coupled to the input artificial uniform transmission lines of the two harmonic control-based distributed power amplifiers, the output artificial non-uniform transmission lines of the two harmonic control-based distributed power amplifiers are coupled via the power combination network, and the power combination network is cascaded with the class-J amplifier output matching network.

The present disclosure provides a hybrid cascaded multi-octave class-J distributed power amplifier, which includes a drive stage power amplification unit, a (lumped) wideband matching network, and the class-J distributed ultra-wideband power amplifier of power combination. The drive stage power amplification unit, the wideband matching network and the class-J distributed ultra-wideband power amplifier of power combination are sequentially cascaded along a signal transmission direction, and the drive stage power amplification unit is formed by parallel-connecting a negative feedback network and a common source-common gate-common gate three-level stacking structure.

The present disclosure provides an optimization method of the harmonic control-based distributed power amplifier, which can be carried out in the following steps:

at step 1, dividing a working frequency band into $\Delta f_1$, $\Delta f_2$ and $\Delta f_3$, setting a fundamental frequency to $f_1 (f_1 \in \Delta f_1)$, and obtaining an optimal fundamental wave load impedance $Z_{10}$ by load pull, using $Z_{10}$ as a second or third-order fixed harmonic load impedance of a frequency point within the $\Delta f_2$ frequency band, wherein a class-J mode second-order harmonic load impedance of $f_1$ is calculated in the following formula (1.1):

$$Z_{12} = \frac{0.5(V_{DD} - V_K)\alpha j}{\frac{2I_{max}}{3\pi}} = 0 - j\alpha \frac{3\pi}{8} R_{opt_B} \quad \text{(imaginary part)} \quad (1.1)$$

wherein $V_{DD}$ is a voltage of a power supply, $V_K$ is a knee voltage of a transistor, $I_{max}$ is a maximal drain current of a transistor, $-1 \leq \alpha \leq 1$ is a constant parameter, $R_{opt_B} = 2(V_{DD} - V_K)/I_{max}$ is an optimal fundamental wave load impedance of a class-B radio frequency power amplifier (PA);

at step 2, setting the fundamental wave to $f_2 (f_2 \in \Delta f_2$, $f_1 = 2f_2)$ and fixing $Z_{10}$ as a second-order harmonic load impedance, namely, $Z_{22} = Z_{10}$, and obtaining an optimal fundamental wave load impedance $Z_{20}$ by load pull, wherein $Z_{20}$ is affected by the second-order harmonic load impedance $Z_{22}$.

at step 3, setting the fundamental frequency of $f_3 (f_3 \in \Delta f_3$, $f_1 = 3f_3)$, fixing $Z_{10}$ as a third-order harmonic load impedance, namely, $Z_{33} = Z_{10}$ fixing $Z_{20}$ as a second-order harmonic load impedance, namely, $Z_{32} = Z_{20}$ and obtaining an optimal fundamental wave load impedance $Z_{30}$ by load pull, wherein $Z_{30}$ is affected by the second-order harmonic load impedance $Z_{32}$ and the third-order harmonic load impedance $Z_{33}$.

at step 4, by substituting the optimal fundamental wave impedance into the following formula, calculating an initial value of a drain line impedance:

$$G_{CD(1)} = G_{OPT(1)} \quad (1.2)$$

$$G_{CD(i \geq 2)} = \left( \frac{G_{OPT(1)}^2}{G_{DL} + G_{OPT(1)}} + \sum_{k=2}^{i} G_{OPT(k)} \right) \quad (1.3)$$

wherein $G_{CD(1)}$ is an optimal characteristic conductance of a first-segment drain line, $C_{OPT(1)}$ is an optimal fundamental wave conductance of a first-level transistor, $G_{CD(n)}$ is an optimal characteristic conductance of an n-th-segment drain line, $G_{DL}$ is a drain terminating resistance, $G_{OPT(n)} = 1/R_{OPT(n)} = \text{re}(Z_{opt(n)})$ is an optimal fundamental wave conductance of an n-th-level transistor, and $G_{OPT(k)}$ is an optimal fundamental wave conductance of a k-th-level transistor;

determining an initial value of a gate line impedance in the following formula:

$$G_{CG(i)} = \sum_{k=i}^{n} G_{IN(k)} \quad (1.4)$$

wherein $G_{CG(i)}$ is an optimal characteristic conductance of an i-th-segment gate line, and $G_{IN(k)}$ is an input conductance of the k-th-level transistor;

further, an electrical length of the gate line and an electrical length of the drain line satisfy the following relationship, wherein $\theta_{CG(i)}$ is an electrical length of an i-th-segment gate line and $\theta_{CD(i)}$ is an electrical length of an i-th-segment drain line:

$$\theta_{CG(i)} = \theta_{CD(i)} \quad (1.5)$$

at step 5, terminating the second-order harmonic impedance of the $\Delta f_1$ frequency band to a pure reactance part to realize a class-J working mode, and adjusting the electrical lengths of the gate line and the drain line, and when the condition of $\theta_{CG(i)} = \theta_{CD(i)}$ is satisfied, introducing reactance to offset an imaginary component of the optimal fundamental wave impedance so as to complete optimization on the harmonic control-based distributed power amplifier.

In the present disclosure, based on physics-based high precision model, parasitic parameters of the wideband transistors are analyzed and the high-octave high-efficiency class-J non-uniform distributed power amplifier based on harmonic control comprehensive method is designed. Compared with the conventional power amplifiers, the class-J non-uniform distributed power amplifier has the advantages of high efficiency, large power and large bandwidth: firstly, the non-uniform distributed amplifier can accurately control each level of impedance, reducing the loss of the artificial transmission line; secondly, the ultra-wideband power combination realizes large power output, ensuring the monolithic high power density; thirdly, the harmonic control comprehensive technology based on load pull is applied to the distributed amplifier; the class-J amplifier matching network is introduced for the first time on the basis of the conventional distributed amplifier, effectively improving the efficiency while ensuring ultra-wideband working.

Based on load pull method and harmonic control technology, the present disclosure provides a harmonic impedance control method of a class-J ultra-wideband power amplifier and a designing method of a class-J distributed amplifier. A purely reactive terminal network is added to an NDA terminal open-circuit structure, which can not only improve port characteristics and increase the system stability, but also fuse the terminal network structure into the matching network to improve the circuit utilization rate. The parallel connection of the three-level stacking structure and the negative feedback network and the series connection of the first-order equalizer matching network to the input port can realize high-performance drive stage. Thus, the power amplifier finally implemented has the characteristics of large power, high efficiency, ultra-wideband, high gain and high integration.

In the present disclosure, based on the research basics of precision Advanced Spice Model (ASM) physics-based model, a multi-octave high-performance distributed amplifier is designed, which includes a compact ultra-wideband high-balance power combiner circuit under improved NDA structure, a class-J distributed amplifier circuit under load pull, and a hybrid cascaded drive amplifier circuit. Based on circuit model, the circuit principle is analyzed from basic theoretical architecture and the circuit design is optimized.

Specifically, by using the improved NDA of the purely reactive terminal network, the input and output characteristics are improved; by researching on coupling tap inductance structure, modeling is carried out to effectively realize the designing of the super-miniature, ultra-wideband and high-balance power combiner; by using the harmonic load pull technology, harmonic impedance optimization of the class-B biased power amplifier is effectively realized and the high-efficiency class-J distributed amplifier circuit is constructed; by optimizing the complex characteristics of the high-frequency-band characteristic impedance of the artificial transmission line, the harmonic control of the class-J distributed amplifier is realized; by optimizing the output matching network, compromise processing of the high-efficiency harmonic control and the maximal output power is realized; a negative feedback type reactive wideband amplifier is designed as drive stage and extremely high system gain indexes are obtained with small sizes by hybrid cascading method.

In the present disclosure, it is possible to execute multi-frequency-band transmission using single power amplifier chip, reducing physical space and system complexity, expanding the chip application scope and making it applicable to the military and civil application scenarios. In this way, the problems of shortage of domestic production capacity and the like are solved, bringing high social value. Further, the monolithic integrated ultra-wideband power amplifier chip can be well controlled in costs, with its price far lower than that of the same types of modules commercially available on the markets, bringing high economic value.

BRIEF DESCRIPTIONS OF THE DRAWINGS

DETAILED DESCRIPTIONS OF EMBODIMENTS

Figure 1:
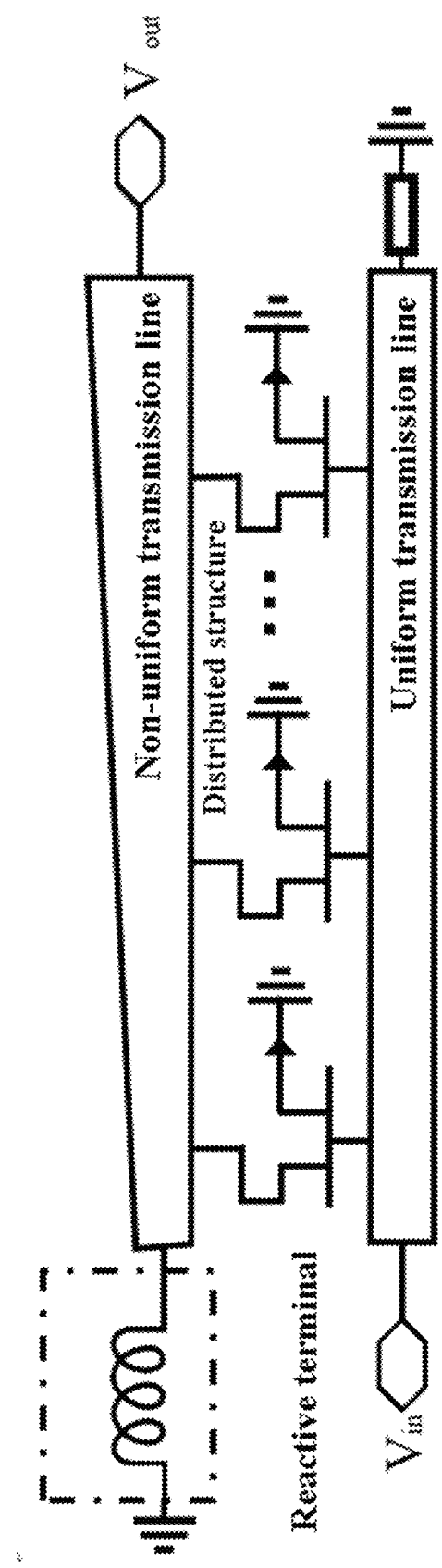
FIG. 1 is a topological schematic diagram illustrating a circuit structure of a conventional NDA.
Figure 2:
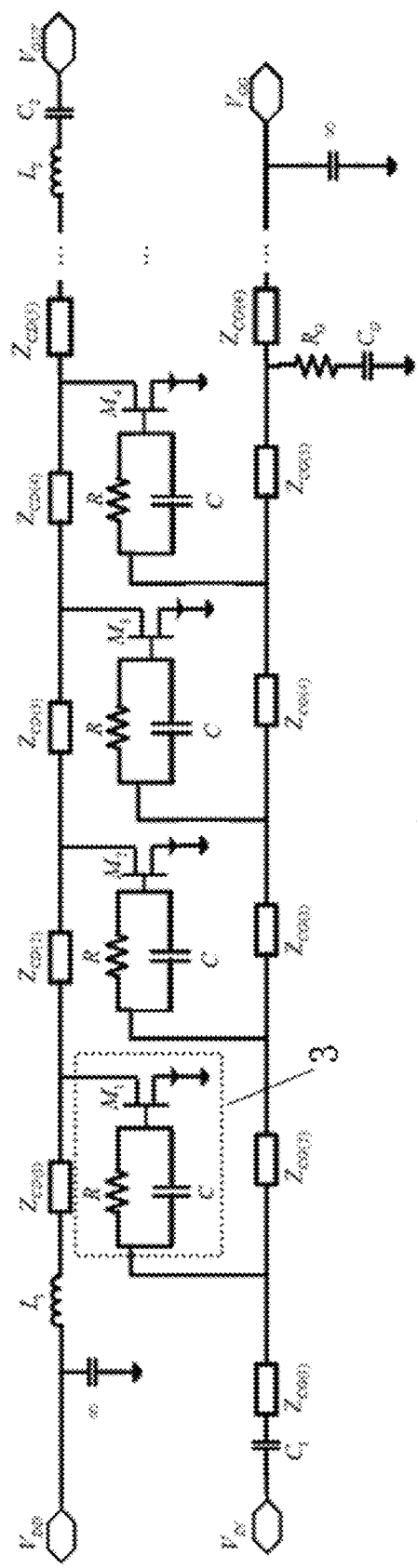
FIG. 2 shows a circuit architecture diagram of a harmonic control-based distributed power amplifier according to a specific implementation 1 of the present disclosure.
Figure 3:
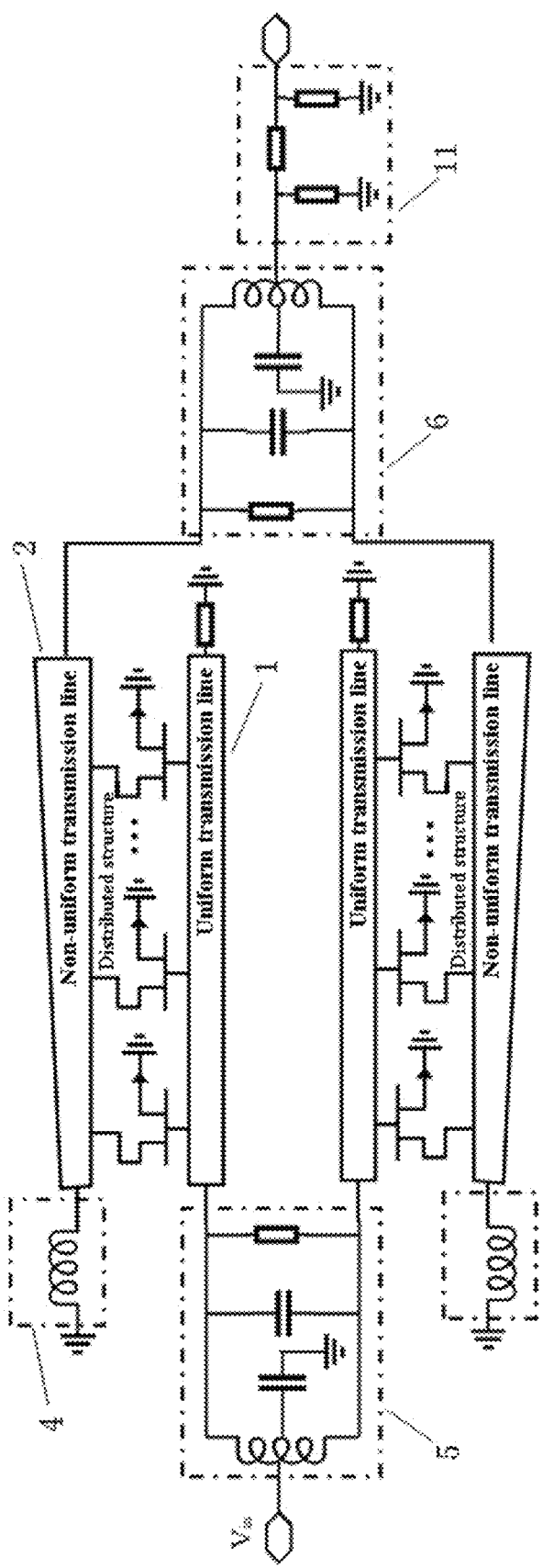
FIG. 3 shows a circuit architecture diagram of a class-J distributed ultra-wideband power amplifier of power combination according to a specific implementation 2 of the present disclosure.
Figure 4:
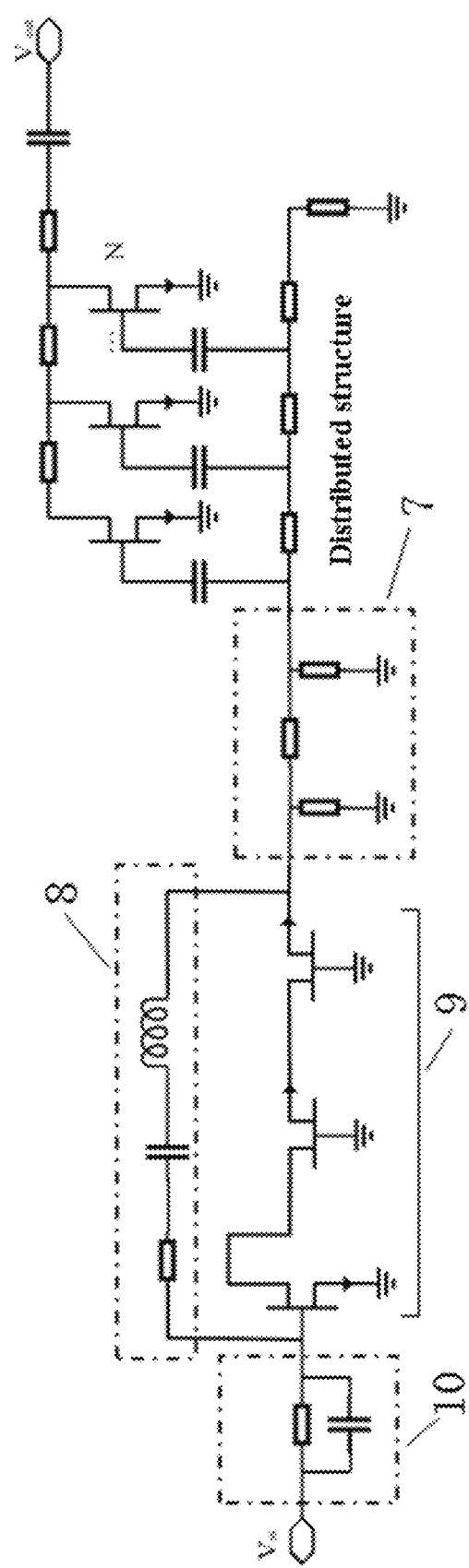
FIG. 4 shows a circuit architecture diagram of a hybrid cascaded multi-octave class-J distributed power amplifier according to a specific implementation 3 of the present disclosure.

Specific implementation 1: in this implementation, the harmonic control-based distributed power amplifier includes an input artificial uniform transmission line 1, an output artificial non-uniform transmission line 2 and plural gain units 3; two ports of the output artificial non-uniform transmission line 2 are connected respectively with reactive terminals 4 ($L_1$ and $L_2$), and in each gain unit 3, a gate electrode of a transistor is connected with an RC parallel resonant circuit.

Specific implementation 2: this implementation differs from the specific implementation 1 in that an output end of the output artificial non-uniform transmission line 2 is connected with a class-J (amplifier output) matching network.

Specific implementation 3: in this implementation, the class-J distributed ultra-wideband power amplifier of power combination includes two harmonic control-based distributed power amplifiers, a power distribution network 5, a power combination network 6 and a class-J amplifier output matching network 11; two ports of the power distribution network 5 are respectively coupled to the input artificial uniform transmission lines 1 of the two harmonic control-based distributed power amplifiers, the output artificial non-uniform transmission lines 2 of the two harmonic control-based distributed power amplifiers are coupled via the power combination network 6, and the power combination network 6 is cascaded with the class-J amplifier output matching network 11.

In this implementation, wide band power combination is performed on two improved NDAs at the output port. In the present disclosure, lumped power divider and power combiner based on tap coupling inductance solve the problems of large area and narrow bandwidth of the conventional power combination, and by using planar thin-film inductive coupling technology, a desired inductance amount is reduced and a miniature passive device is obtained.

Specific implementation 4: in this implementation, the hybrid cascaded multi-octave class-J distributed power amplifier includes a drive stage power amplification unit, a (lumped) wideband matching network 7, and the class-J distributed ultra-wideband power amplifier of power combination; the drive stage power amplification unit, the wideband matching network 7 and the class-J distributed ultra-wideband power amplifier of power combination are sequentially cascaded along a signal transmission direction, and the drive stage power amplification unit is formed by parallel-connecting a negative feedback network 8 and a common source-common gate-common gate three-level stacking structure 9.

In this implementation, the class-J distributed ultra-wideband power amplifier of power combination is used as output stage and a miniature negative feedback reactive drive wideband power amplifier is designed and integrated and the hybrid cascading method is used to realize high-power and high-gain output of the MMIC power amplifier. In the drive stage power amplifier, the transistor uses the common source-common gate-common gate three-level stacking structure to obtain higher and flatter gain and bandwidth, so as to obtain a higher gain bandwidth product. With the parallel negative feedback network structure, the series resistor and the series reactor in the network improve the gain flatness of the gain and the stability of the transistor under large bandwidth. At the input port, the first-order equalizer is series-connected as gain compensation network to obtain excellent wideband matching and gain consistency. Further, the lumped wideband matching network is used to implement hybrid cascading of the reactive and distributed power amplifiers so as to realize a high-gain MMIC power amplifier under ultra-wideband.

Specific implementation 5: this implementation differs from the specific implementation 4 in that a gain compensation network 10 is coupled between a signal input end and the drive stage power amplification unit.

Specific implementation 6: this implementation differs from the specific implementation 5 in that the gain compensation network 10 is a first-order equalizer.

Specific implementation 7: in this implementation, an optimization method of the harmonic control-based distributed power amplifier, wherein the optimization method is carried out in the following steps:

at step 1, dividing a working frequency band into $\Delta f_1$, $\Delta f_2$ and $\Delta f_3$, setting a fundamental frequency to $f_1(f_1 \in \Delta f_1)$, and obtaining an optimal fundamental wave load impedance $Z_{10}$ by load pull, using $Z_{10}$ as a second or third-order fixed harmonic load impedance of a frequency point within the $\Delta f_2$ frequency band, wherein a class-J mode second-order harmonic load impedance of J is calculated in the following formula (1.1):

$$Z_{12} = \frac{0.5(V_{DD} - V_K)\alpha j}{\frac{2I_{max}}{3\pi}} = 0 - j\alpha \frac{3\pi}{8} R_{opt_B}$$

(imaginary part) (1.1)

wherein $V_{DD}$ is a voltage of a power supply, $V_K$ is a knee voltage of a transistor, $I_{max}$ is a maximal drain current of a transistor $-1 \leq \alpha \leq 1$ is a constant parameter, $R_{opt_B} = 2(V_{DD}-V_K)/I_{max}$ is an optimal fundamental wave load impedance of a class-B power amplifier (PA);

at step 2, setting the fundamental wave to $f_2(f_2 \in \Delta f_2$, $f_1 = 2f_2)$, and fixing $Z_{10}$ as a second-order harmonic load impedance, namely, $Z_{22} = Z_{10}$, and obtaining an optimal fundamental wave load impedance $Z_{20}$ by load pull, wherein $Z_{20}$ is affected by the second-order harmonic load impedance $Z_{22}$;

at step 3, setting the fundamental frequency to $f_3(f_3 \in \Delta f_3$, $f_1 = 3f_3)$, fixing $Z_{10}$ as a third-order harmonic load impedance, namely, $Z_{33}$ $Z_{10}$, fixing $Z_{20}$ as a second-order harmonic load impedance, namely, $Z_{32} = Z_{20}$, and obtaining an optimal fundamental wave load impedance $Z_{30}$ by load pull, wherein $Z_{30}$ is affected by the second-order harmonic load impedance $Z_{32}$ and the third-order harmonic load impedance 233;

at step 4, by substituting the optimal fundamental wave impedance into the following formula, calculating an initial value of a drain line impedance:

$$G_{CD(1)} = G_{OPT(1)} \quad (1.2)$$

$$G_{CD(i \geq 2)} = \left( \frac{G_{OPT(1)}^2}{G_{DL} + G_{OPT(1)}} + \sum_{k=2}^{i} G_{OPT(k)} \right) \quad (1.3)$$

wherein $G_{CD(1)}$ is an optimal characteristic conductance of a first-segment drain line, $G_{OPT(1)}$ is an optimal fundamental wave conductance of a first-level transistor, $G_{CD(n)}$ is an optimal characteristic conductance of an n-th-segment drain line, $G_{DL}$ is a drain terminating resistance, $G_{OPT(n)} = 1/R_{OPT(n)} = \text{re}(Z_{opt(n)})$ is an optimal fundamental wave conductance of an n-th-level transistor, and $G_{OPT(k)}$ is an optimal fundamental wave conductance of a k-th-level transistor;

determining an initial value of a gate line impedance in the following formula:

$$G_{CG(i)} = \sum_{k=i}^{n} G_{IN(k)} \quad (1.4)$$

wherein $G_{CG(i)}$ is an optimal characteristic conductance of an i-th-segment gate line, and $G_{IN(k)}$ is an input conductance of the k-th-level transistor;

further, an electrical length of the gate line and an electrical length of the drain line satisfy the following relationship, wherein $\theta_{CG(i)}$ is an electrical length of an i-th-segment gate line and $\theta_{CD(i)}$ is an electrical length of an i-th-segment drain line:

$$\theta_{CG(i)} = \theta_{CD(i)} \quad (1.5)$$

at step 5, terminating the second-order harmonic impedance of the $\Delta f_1$ frequency band to a pure reactance part to realize a class-J working mode, and adjusting the electrical lengths of the gate line and the drain line, and when the condition of $\theta_{CG(i)} = \theta_{CD(i)}$ is satisfied, introducing reactance to offset an imaginary component of the optimal fundamental wave impedance so as to complete optimization on the harmonic control-based distributed power amplifier.

In this implementation, the non-negligible imaginary component of the artificial transmission line at high frequency end is absorbed into the class-J amplifier output matching network so as to obtain a low-loss, large-bandwidth and high-efficiency harmonic-control-based class-J distributed amplifier.

In this implementation, by using load pull technology, optimization is performed on high-order harmonic to know the influence of the high-order harmonic on the output power and efficiency; secondly, the influence of the high-frequency fundamental wave and low-frequency harmonic impedances of the improved NDA on the output power and efficiency is analyzed; thirdly, based on the harmonic-fundamental wave impedance allocation model, the influence of each harmonic impedance and each fundamental wave impedance of the class-J ultra-wideband power amplifier on the output power and efficiency is analyzed, and based on an analysis result, key parameters affecting an efficiency and power mathematic model of the class-J ultra-wideband power amplifier are obtained, where the key parameters include the fundamental wave impedance, the harmonic impedance, the terminating load and the working mode and the like of each level of transistor; fourthly, based on the above key parameters, the circuit architecture of the class-J distributed power amplifier is designed and the non-negligible imaginary component of the artificial transmission line at high frequency end is absorbed into the class-J amplifier output matching network so as to obtain a low-loss, large-bandwidth and high-efficiency harmonic-control-based class-J distributed amplifier.

Specific implementation 8: this implementation differs from the specific implementation 7 in that $G_{DL} = 0$ in the step 4.

Specific implementation 9: this implementation differs from the specific implementation 7 or 8 in that in the step 5, the gate line and the drain line are respectively terminated with inductors $L_1$ and $L_2$.

Embodiment 1: in this embodiment, the harmonic control-based distributed power amplifier includes an input artificial uniform transmission line, an output artificial non-uniform transmission line, and plural gain units, wherein two ports of the output artificial non-uniform transmission line are respectively connected with reactive terminals, and in each gain unit, a gate electrode of a transistor is connected with an RC parallel resonant circuit.

Embodiment 2: in this embodiment, the optimization method of the harmonic control-based distributed power amplifier is carried out in the following steps:

at step 1, dividing an intra-band working frequency band into three parts: $\Delta f_1 = 9\sim18$ GHz, $\Delta f_2 = 6\sim9$ GHz and $\Delta f_3 = 2\sim6$ GHz, wherein all high-order harmonics of $\Delta f_1$ are all outside the working frequency band; the second-order harmonic of $\Delta f_2$ is within the working frequency band, and the third-order or higher harmonic is outside the working frequency band; the third-order or higher harmonic of $\Delta f_3$ is within the working frequency band; setting a fundamental frequency to $f_1(f_1 \in \Delta f_1)$ and obtaining an optimal fundamental wave load impedance $Z_{10}$ by load pull, using $Z_{10}$ as a second or third-order fixed harmonic load impedance of a frequency point within the $\Delta f_2$ frequency band, wherein a class-J mode second-order harmonic load impedance of $f_1$ is calculated in the following formula (1.1):

$$Z_{12} = \frac{0.5(V_{DD} - V_K)\alpha j}{\frac{2I_{max}}{3\pi}} = 0 - j\alpha \frac{3\pi}{8} R_{opt_B} \quad (1.1)$$

wherein $V_{DD}$ is a voltage of a power supply, $V_K$ is a knee voltage of a transistor, $I_{max}$ is a maximal drain current of a transistor $-1 \leq \alpha \leq 1$ is a constant parameter, $R_{opt_B} = 2(V_{DD} - V_K)/I_{max}$ is an optimal fundamental wave load impedance of a class-B power amplifier (PA);

at step 2, setting the fundamental wave to $f_2(f_2 \in \Delta f_2, f_1 = 2f_2)$, and fixing $Z_{10}$ as a second-order harmonic load impedance, namely, $Z_{22} = Z_{10}$, and obtaining an optimal fundamental wave load impedance $Z_{20}$ by load pull, wherein $Z_{20}$ is affected by the second-order harmonic load impedance $Z_{22}$;

at step 3, setting the fundamental frequency to $f_3(f_3 \in \Delta f_3, f_1 = 3f_3)$, fixing $Z_{10}$ as a third-order harmonic load impedance, namely, $Z_{33} = Z_{10}$, fixing $Z_{30}$ as a second-order harmonic load impedance, namely, $Z_{32} = Z_{20}$, and obtaining an optimal fundamental wave load impedance $Z_{30}$ by load pull, wherein $Z_{30}$ is affected by the second-order harmonic load impedance $Z_{32}$ and the third-order harmonic load impedance $Z_{33}$;

at step 4, by substituting the optimal fundamental wave impedance into the following formula, calculating an initial value of a drain line impedance:

$$G_{CD(1)} = G_{OPT(1)} \quad (1.2)$$

$$G_{CD(i \geq 2)} = \left( \frac{G_{OPT(1)}^2}{G_{DL} + G_{OPT(1)}} + \sum_{k=2}^{i} G_{OPT(k)} \right) \quad (1.3)$$

wherein $G_{CD(1)}$ is an optimal characteristic conductance of a first-segment drain line, $G_{OPT(1)}$ is an optimal fundamental wave conductance of a first-level transistor, $G_{CD(n)}$ is an optimal characteristic conductance of an n-th-segment drain line, $G_{DL}$ is a drain terminating resistance, $G_{DL} = 0$, $G_{OPT(n)} = 1/R_{OPT(n)} = \text{re}(Z_{opt(n)})$ is an optimal fundamental wave conductance of an n-th-level transistor, and $G_{OPT(k)}$ is an optimal fundamental wave conductance of a k-th-level transistor;

determining an initial value of a gate line impedance in the following formula:

$$G_{CG(i)} = \sum_{k=i}^{n} G_{IN(k)} \quad (1.4)$$

wherein $G_{CG(i)}$ is an optimal characteristic conductance of an i-th-segment gate line, and $G_{IN(k)}$ is an input conductance of the k-th-level transistor;

further, an electrical length of the gate line and an electrical length of the drain line satisfy the following relationship:

$$\theta_{CG(i)} = \theta_{CD(i)} \quad (1.5)$$

at step 5, terminating the gate line and the drain line respectively with inductors $L_1$ and $L_2$ to avoid power consumption of backward echo, terminating the second-order harmonic impedance of the $\Delta f_1$ frequency band to a pure reactance part to realize a class-J working mode, and adjusting the electrical lengths of the gate line and the drain line, and when the condition of $\theta_{CG(i)} = \theta_{CD(i)}$ is satisfied, introducing reactance to offset an imaginary component of the optimal fundamental wave impedance so as to complete optimization on the harmonic control-based distributed power amplifier.

Figure 5:
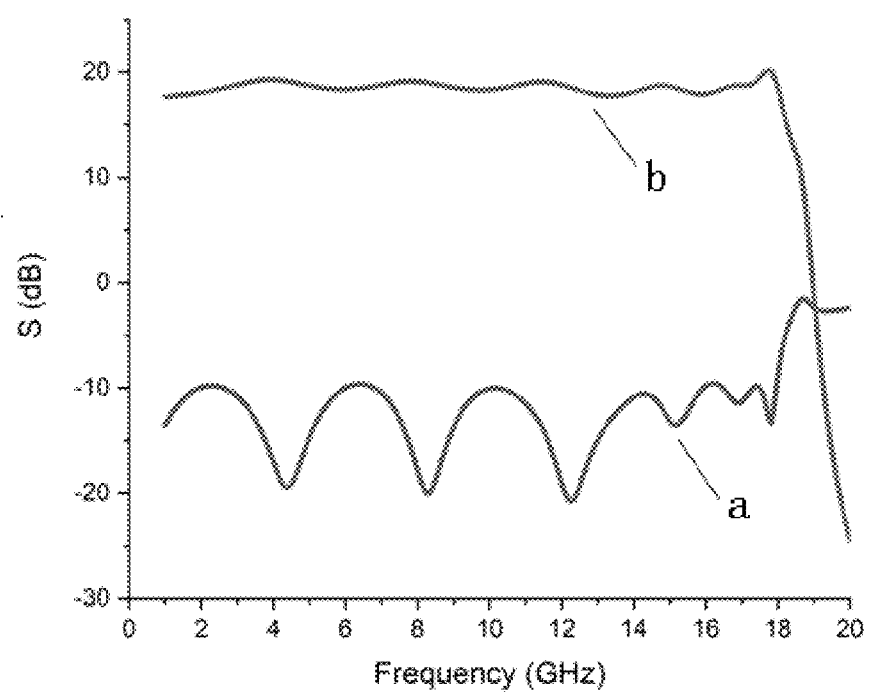
FIG. 5 shows a small signal test diagram of a harmonic control-based distributed power amplifier according to an embodiment of the present disclosure, where a represents return loss and b represents gain.
Figure 6:
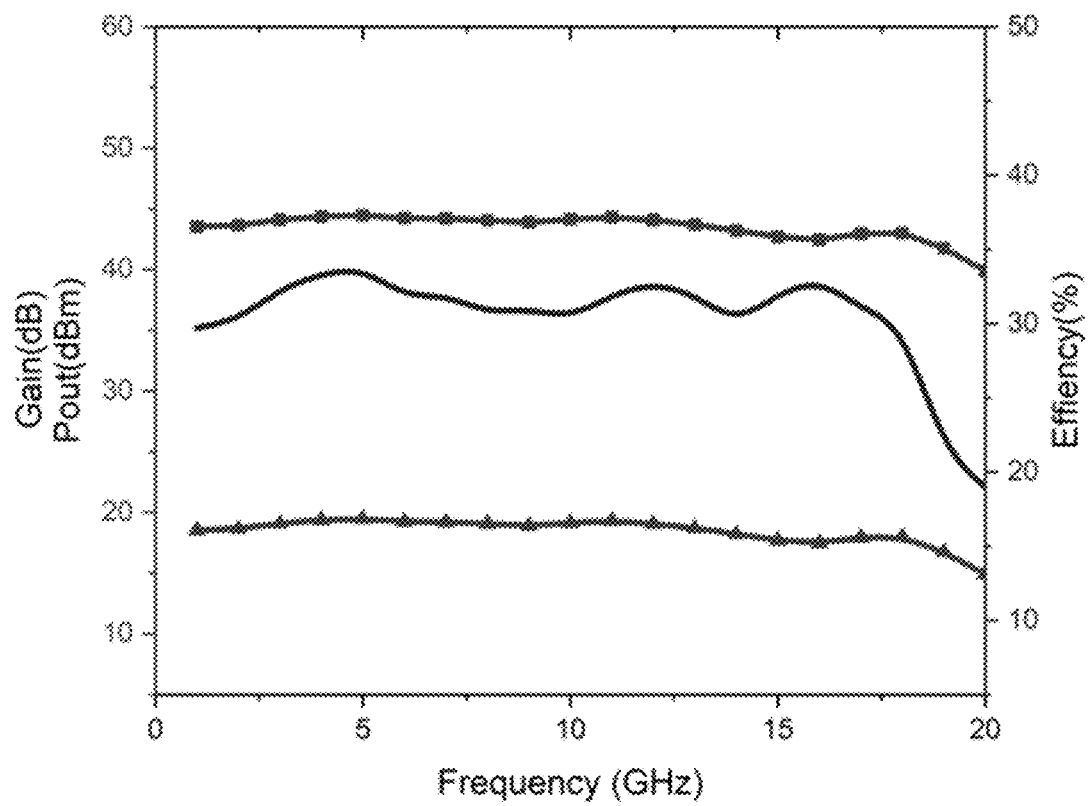
FIG. 6 shows a large signal test diagram of a harmonic control-based distributed power amplifier according to an embodiment of the present disclosure, where ■ represents output power, ▲ represents gain, and - represents efficiency.

The small signal result of FIG. 5 shows the power amplifier within 2-18 GHz has a flat gain of more than 18 dB and a return loss of more than −10 dB. The large signal result of FIG. 6 shows a maximal saturated output power of more than 43 dBm (20 W) and a power-added efficiency of greater than 30% within 2-18 GHz, and the result is far greater than that of the conventional distributed amplifier. It is proved that the class-J distributed amplifier in the present disclosure has the characteristics of ultra-wideband, high efficiency and high gain.

What is claimed is:

1. An optimization method of a harmonic control-based distributed power amplifier, wherein the harmonic control-based distributed power amplifier, comprises: an input artificial uniform transmission line (1), an output artificial non-uniform transmission line (2), and plural gain units (3), wherein two ports of the output artificial non-uniform transmission line (2) are respectively connected with reactive terminals (4), and in each gain unit (3), a gate electrode of a transistor is connected with an RC parallel resonant circuit, wherein the optimization method is carried out in the following steps:

at step 1, dividing a working frequency band into $\Delta f_1$, $\Delta f_2$ and $\Delta f_3$, setting a fundamental frequency to $f_1$, and obtaining an optimal fundamental wave load impedance $Z_{10}$ by load pull, using $Z_{10}$ as a second or third-order fixed harmonic load impedance of a frequency point within the $\Delta f_2$ frequency band, wherein a class-J mode second-order harmonic load impedance of $f_1$ is calculated in the following formula (1.1):

$$Z_{12} = \frac{0.5(V_{DD} - V_K)\alpha j}{\frac{2I_{max}}{3\pi}} = 0 - j\alpha \frac{3\pi}{8} R_{opt_B} \quad (0.1)$$

wherein $V_{DD}$ is a voltage of a power supply, $V_K$ is a knee voltage of a transistor, $I_{max}$ is a maximal drain current of a transistor $-1 \leq \alpha \leq 1$ is a constant parameter, $R_{opt_B} = 2(V_{DD} - V_K)/I_{max}$ is an optimal fundamental wave load impedance of a class-B power amplifier (PA);

at step 2, setting the fundamental wave to $f_2$, and fixing $Z_{10}$ as a second-order harmonic load impedance, namely, $Z_{22} = Z_{10}$, and obtaining an optimal fundamental wave load impedance $Z_{20}$ by load pull, wherein $Z_{20}$ is affected by the second-order harmonic load impedance $Z_{22}$;

at step 3, setting the fundamental frequency to $f_3$, fixing $Z_{10}$ as a third-order harmonic load impedance, namely, $Z_{33}=Z_{10}$, fixing $Z_{20}$ as a second-order harmonic load impedance, namely, $Z_{32}=Z_{20}$, and obtaining an optimal fundamental wave load impedance $Z_{30}$ by load pull, wherein $Z_{30}$ is affected by the second-order harmonic load impedance $Z_{32}$ and the third-order harmonic load impedance $Z_{33}$;

at step 4, by substituting the optimal fundamental wave impedance into the following formula, calculating an initial value of a drain line impedance:

$$G_{CD(1)}=G_{OPT(1)} \quad (0.2)$$

$$G_{CD(i\geq 2)} = \left( \frac{G_{OPT(1)}^2}{G_{DL}+G_{OPT(1)}} + \sum_{k=2}^{i} G_{OPT(k)} \right) \quad (0.3)$$

wherein $G_{CD(1)}$ is an optimal characteristic conductance of a first-segment drain line, $G_{OPT(1)}$ is an optimal fundamental wave conductance of a first-level transistor, $G_{CD(n)}$ is an optimal characteristic conductance of an n-th-segment drain line, $G_{DL}$ is a drain terminating resistance, $G_{OPT(n)}=1/R_{OPT(n)}=\mathrm{re}(Z_{opt(n)})$ is an optimal fundamental wave conductance of an n-th-level transistor, and $G_{OPT(k)}$ is an optimal fundamental wave conductance of a k-th-level transistor;

determining an initial value of a gate line impedance in the following formula:

$$G_{CG(i)} = \sum_{k=i}^{n} G_{IN(k)} \quad (0.4)$$

wherein $G_{CG(i)}$ is an optimal characteristic conductance of an i-th-segment gate line, and $G_{IN(k)}$ is an input conductance of the k-th-level transistor;

further, an electrical length of the gate line and an electrical length of the drain line satisfy the following relationship, wherein $\theta_{CG(i)}$ is an electrical length of an i-th-segment gate line and $\theta_{CD(i)}$ is an electrical length of an i-th-segment drain line:

$$\theta_{CG(i)}=\theta_{CD(i)} \quad (0.5)$$

at step 5, terminating the second-order harmonic impedance of the $\Delta f_1$ frequency band to a pure reactance part to realize a class-J working mode, and adjusting the electrical lengths is satisfied, of the gate line and the drain line, and when the condition of $\theta_{CG(i)}=\theta_{CD(i)}$ introducing reactance to offset an imaginary component of the optimal fundamental wave impedance so as to complete optimization on the harmonic control-based distributed power amplifier.

2. The optimization method of claim 1, wherein in the step 4, $G_{DL}=0$.

3. The optimization method of claim 1, wherein in the step 5, the gate line and the drain line are respectively terminated with inductors $L_1$ and $L_2$.

* * * * *